United States Patent
Akagawa et al.

(10) Patent No.: US 10,861,915 B2
(45) Date of Patent: Dec. 8, 2020

(54) LIGHT-EMITTING DEVICE AND ELECTRONIC APPARATUS

(71) Applicant: SEIKO EPSON CORPORATION, Tokyo (JP)

(72) Inventors: Suguru Akagawa, Matsumoto (JP); Ryoichi Nozawa, Kamiina-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/548,972

(22) Filed: Aug. 23, 2019

(65) Prior Publication Data

US 2020/0066818 A1 Feb. 27, 2020

(30) Foreign Application Priority Data

Aug. 24, 2018 (JP) .................................. 2018-156999

(51) Int. Cl.
*H01L 27/32* (2006.01)
*H01L 51/52* (2006.01)

(52) U.S. Cl.
CPC ...... *H01L 27/3258* (2013.01); *H01L 27/3223* (2013.01); *H01L 27/3276* (2013.01); *H01L 51/5265* (2013.01)

(58) Field of Classification Search
None
See application file for complete search history.

(56) References Cited

U.S. PATENT DOCUMENTS

| | | |
|---|---|---|
| 2005/0084214 A1 | 4/2005 | Hayashi et al. |
| 2006/0088951 A1 | 4/2006 | Hayashi et al. |
| 2006/0278945 A1 | 12/2006 | Sakurai |
| 2007/0132381 A1 | 6/2007 | Hayashi et al. |
| 2007/0228942 A1 | 10/2007 | Akai et al. |
| 2010/0295759 A1 | 11/2010 | Tanaka |
| 2014/0361273 A1 | 12/2014 | Nozawa |
| 2014/0367661 A1 | 12/2014 | Akagawa et al. |
| 2014/0368106 A1 | 12/2014 | Nozawa |
| 2015/0001558 A1 | 1/2015 | Nozawa et al. |
| 2015/0102323 A1 | 4/2015 | Koshihara et al. |
| 2018/0151643 A1* | 5/2018 | Lee ..................... H01L 51/5012 |

FOREIGN PATENT DOCUMENTS

| | | |
|---|---|---|
| JP | 2005-100943 A | 4/2005 |
| JP | 2006-344496 A | 12/2006 |
| JP | 2007-157606 A | 6/2007 |

(Continued)

*Primary Examiner* — Alexander G Ghyka
(74) *Attorney, Agent, or Firm* — JCIPRNET

(57) ABSTRACT

A light-emitting device includes a substrate having a circuit thereon, a first electrode electrically coupled to the circuit, a second electrode, a light-emitting layer, and a sealing layer including a planarization layer, wherein the first electrode is arranged between the substrate and the second electrode, the light-emitting layer is arranged between the first electrode and the second electrode and emits light in accordance with a current flowing through the light-emitting layer, the planarization layer is arranged on an opposite side of the second electrode from a side on which the light-emitting layer is arranged, and an outer edge of the planarization layer is located inward of an outer edge of the light-emitting layer in plan view.

14 Claims, 8 Drawing Sheets

(56) References Cited

FOREIGN PATENT DOCUMENTS

| | | | |
|---|---|---|---|
| JP | 2007-265792 | A | 10/2007 |
| JP | 2010-272270 | A | 12/2010 |
| JP | 2011-192660 | A | 9/2011 |
| JP | 2014-235958 | A | 12/2014 |
| JP | 2014-241241 | A | 12/2014 |
| JP | 2015-002134 | A | 1/2015 |
| JP | 2018-029070 | A | 2/2018 |
| JP | 2018-125303 | A | 8/2018 |
| KR | 2018-0062109 | A | 6/2018 |

\* cited by examiner

LIGHT-EMITTING DEVICE AND ELECTRONIC APPARATUS

The present application is based on, and claims priority from JP Application Serial Number 2018-156999, filed Aug. 24, 2018, the disclosure of which is hereby incorporated by reference herein in its entirety.

BACKGROUND

1. Technical Field

The present disclosure relates to a light-emitting device and an electronic apparatus.

2. Related Art

A light-emitting device including a light-emitting element such as an organic electro luminescence (EL) element is suggested. For example, JP-A-2007-157606 discloses an EL display device including an organic EL element and a sealing layer covering the organic EL element. The organic EL element includes a pixel electrode, a cathode, and an organic functional layer that that emits light according to the amount of current and is disposed between the pixel electrode and the cathode.

In general, the organic functional layer included in the organic EL element is likely to be deteriorated by reacting with moisture in the atmosphere. When the light-emitting element is deteriorated, a non-light-emitting portion called a dark spot is formed, and the life of the light-emitting element becomes short.

The light-emitting device of JP-A-2007-157606 includes a first electrode and a second electrode sandwiching a light-emitting functional layer, and a sealing structure formed on the surface of the second electrode. The sealing structure includes an organic buffer layer formed from an organic material, and the organic buffer layer is covered with a gas barrier layer formed from an inorganic material. An outer edge of the organic buffer layer is arranged farther outside than an outer edge of the light-emitting layer. Therefore, the outer edge of the light-emitting device is arranged farther outside than the outer edge of the organic buffer layer, and there is a problem that the distance from the outer edge of the light-emitting layer to the outer edge of the light-emitting device becomes large. That is, there is a problem that the width of a frame around a light-emitting region in the light-emitting device becomes large.

SUMMARY

An aspect of a light-emitting device according to the present disclosure includes a substrate having a circuit thereon, a first electrode electrically coupled to the circuit, a second electrode, a light-emitting layer, and a sealing layer including a planarization layer, wherein the first electrode is arranged between the substrate and the second electrode, the light-emitting layer is arranged between the first electrode and the second electrode, and emits light in accordance with the current flowing through the light-emitting layer, the planarization layer is arranged on an opposite side of the second electrode from a side on which the light-emitting layer is arranged, and an outer edge of the planarization layer is located inward of an outer edge of the light-emitting layer in plan view.

DESCRIPTION OF EXEMPLARY EMBODIMENTS

Figure 1:
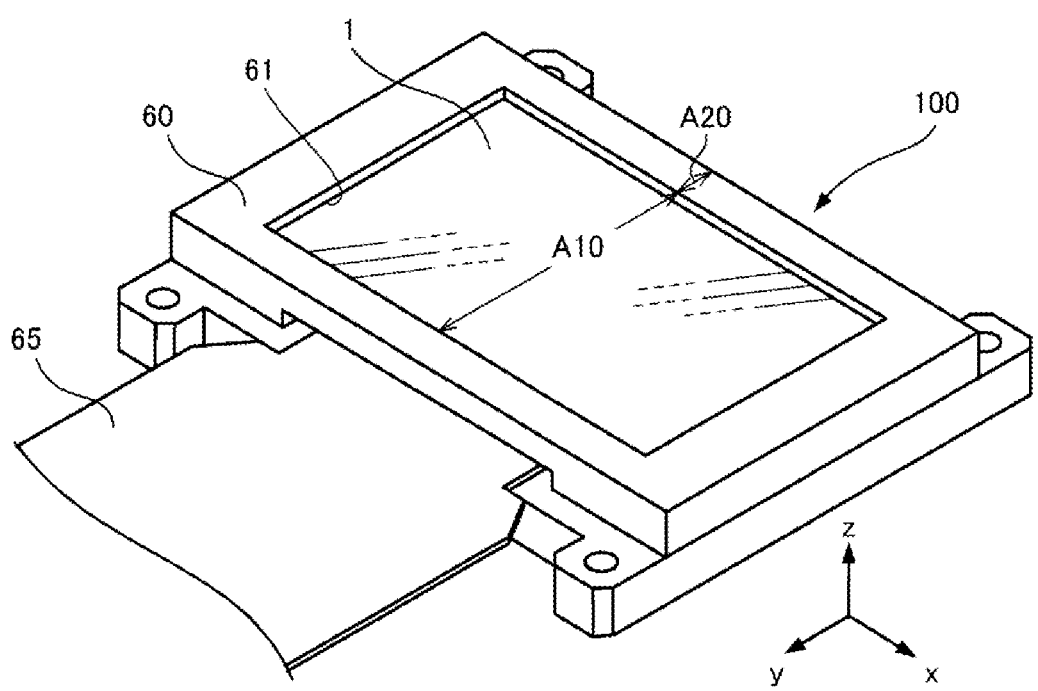
FIG. 1 is a perspective view illustrating a light-emitting device according to First Embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the disclosure in the following descriptions. Note that, in the accompanying drawings, various hatchings may be provided as appropriate in order to facilitate understanding of the arrangement of the configuration of each of the layers.

1. Light-Emitting Device

1-1. First Embodiment

As an example of a light-emitting device of the present disclosure, an organic EL display device for displaying an image will be described as an example.

1-1A. Overall Configuration

FIG. 1 is a plan view illustrating a light-emitting device according to First Embodiment. Note that, for the convenience of explanation, the description will be made appropriately using an x-axis, a y-axis, and a z-axis orthogonal to each other illustrated in FIG. 1. Note that, the direction of an arrow in the z-axis is a +z direction, which is referred to as an "upper side", and the direction opposite to the arrow in the z-axis is a −z direction, which is referred to as a "lower side". Further, in the present specification, viewing from the −z direction is referred to as "plan view". Additionally, viewing from a direction parallel to x-y plane is referred to as "cross-sectional view".

A light-emitting device 100 illustrated in FIG. 1 is an organic electro luminescence (EL) display device including an Organic Light Emitting Diode (OLED) as a light-emitting element.

The light-emitting device 100 is used as a micro display configured to display an image in a head-mounted display, for example.

The light-emitting device 100 includes a case 60 including an opening 61, a display panel 1 disposed in the case 60, and a Flexible printed circuits (FPC) substrate 65 electrically coupled to the display panel 1. Note that, although not illustrated, the FPC substrate 65 is coupled to an upper circuit disposed outside.

The light-emitting device 100 includes a light-emitting region A10 having a rectangular shape in plan view, and a non-light-emitting region A20 surrounding the light-emitting region A10. The light-emitting region A10 is a display region in which an image is displayed.

1-1B. Electrical Configuration

Figure 2:
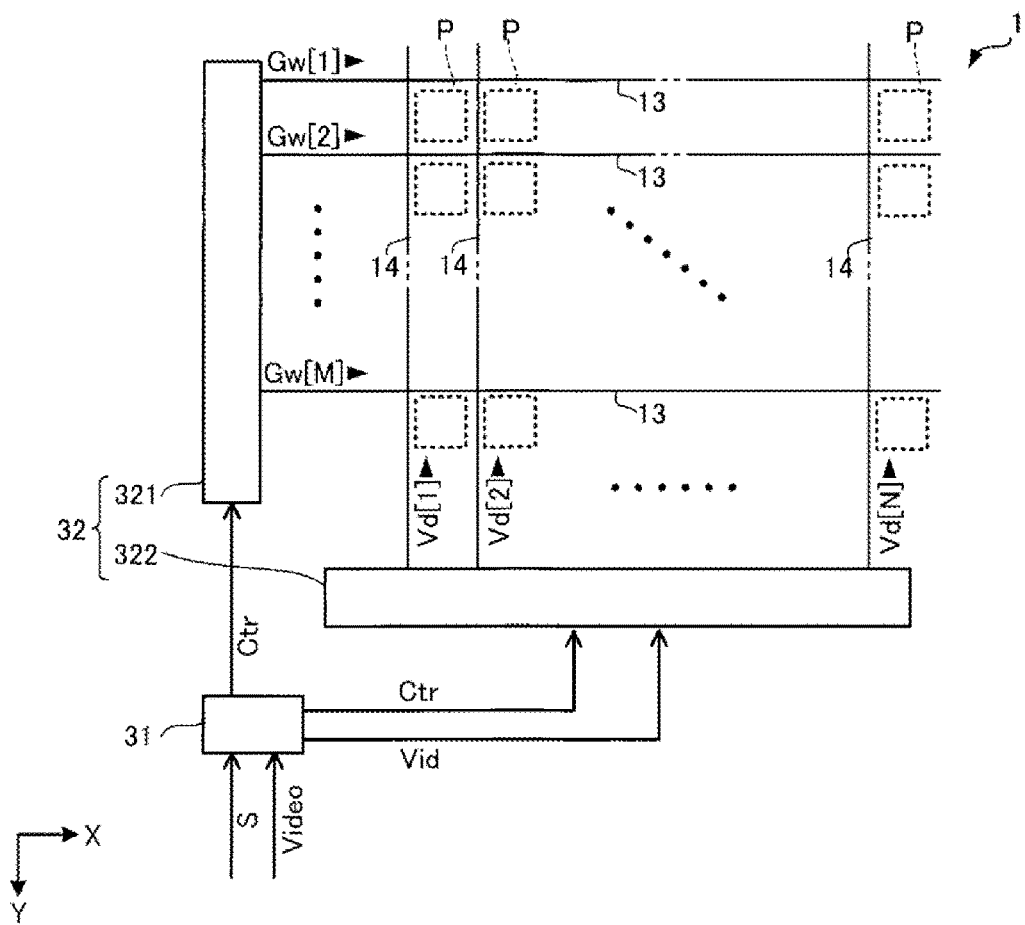
FIG. 2 is a block diagram illustrating an electrical configuration of the display panel according to First Embodiment.

FIG. 2 is a block diagram illustrating an electrical configuration of the display panel 10 according to First Embodiment. Note that, for the convenience of explanation, the following description will be made appropriately using an X-axis and a Y-axis orthogonal to each other illustrated in FIG. 2.

As illustrated in FIG. 2, the display panel 1 includes M scanning lines 13 extending along the X-axis, N data lines 14 intersecting the scanning lines 13 and extending along the Y-axis, and a plurality of pixels P. The pixels P corresponds to each intersection between the M scanning lines 13 and the N data lines 14, and is aligned in a matrix. The scanning lines 13, the data lines 14, and the pixels P are arranged in the light-emitting region A10 illustrated in FIG. 1.

Further, as illustrated in FIG. 2, the display panel 1 includes a control circuit 31 and a driving circuit 32. The control circuit 31 and the driving circuit 32 are arranged in the non-light-emitting region A20 illustrated in FIG. 1. Further, the display panel 1 is coupled to a power supply circuit (not illustrated).

The control circuit 31 illustrated in FIG. 2 is configured to control display of the image. An image data Video, which is digital, is supplied from the upper circuit (not illustrated) synchronously with a synchronization signal S to the control circuit 31. The control circuit 31 generates a control signal Ctr based on the synchronization signal S and supplies the control signal Ctr to the driving circuit 32. Further, the control circuit 31 generates an image signal Vid, which is analog, based on the image data Video, and supplies the image signal Vid to the driving circuit 32. Note that, the image data Video described above is data specifying a gradation level of the pixels P by, for example, 8 bits. The synchronization signal S is a signal including a vertical synchronization signal, a horizontal synchronization signal, and a dot clock signal.

The driving circuit 32 includes a scanning line driving circuit 321 and a data line driving circuit 322. The scanning line driving circuit 321 is coupled to the M scanning lines 13. Based on the control signal Ctr, the scanning line driving circuit 321 generates scanning signals Gw [1], Gw [2] to Gw [M] for sequentially selecting the M scanning lines 13 one by one within one frame period, and outputs the generated scanning signals to the M scanning lines 13. Further, the data line driving circuit 322 is coupled to the N data lines 14. Based on the image signal Vid and the control signal Ctr, the data line driving circuit 322 generates data signals Vd [1], Vd [2] to Vd [N] according to the gradation to be displayed for each pixel P, and outputs the generated data signals to the N data lines 14.

Note that, as illustrated in the drawings, the driving circuit 32 is divided into the scanning line driving circuit 321 and the data line driving circuit 322, but the scanning line driving circuit 321 and the data line driving circuit 322 may be integrated as one circuit. Further, as illustrated in the drawings, the control circuit 31 is disposed on the display panel 1, but the control circuit 31 may be disposed on the FPC substrate 65, for example.

Figure 3:
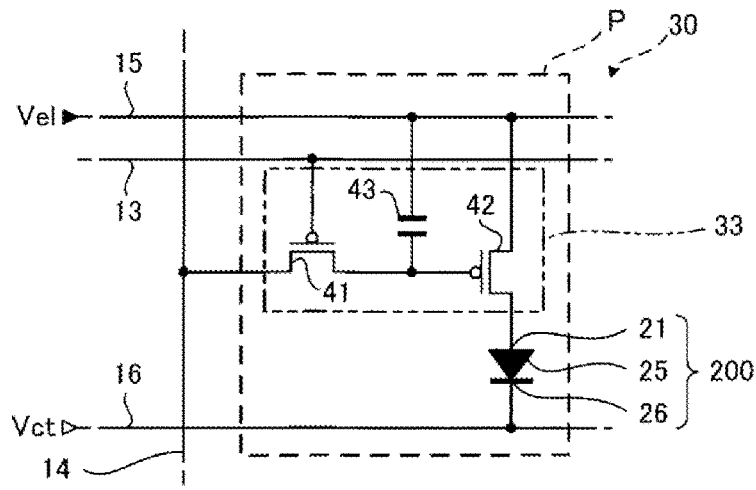
FIG. 3 is an equivalent circuit diagram of a pixel according to First Embodiment.

FIG. 3 is an equivalent circuit diagram of a pixel according to First Embodiment. As illustrated in FIG. 3, the pixel P includes a light-emitting element 200 constituted of an OLED, and a current supply circuit 33 supplying current to the light-emitting element 200. Note that, the current supply circuit 33, the scanning lines 13, the data lines 14, and the power supplying lines 15 and 16 coupled to the power supply circuit (not illustrated) constitute a pixel circuit 30, which is an example of a "circuit".

The light-emitting device 200 includes a pixel electrode 21 as a "first electrode", an organic layer 25, and a counter electrode 26 as a "second electrode". The pixel electrode 21 functions as an anode for supplying holes to the organic layer 25. The counter electrode 26 functions as a cathode for supplying electrons to the organic layer 25. In the light-emitting element 200, the holes supplied from the pixel electrode 21 and the electrons supplied from the counter electrode 26 are recombined in the organic layer 25, and the organic layer 25 emits white light. Note that, the power supplying line 16 is electrically coupled to the counter electrode 26. A power supply potential Vct on a low potential side is supplied from the power supply circuit (not illustrated) to the power supplying line 16.

The current supply circuit 33 includes a switching transistor 41, a driving transistor 42, and a retention capacitor 43.

The gate of the switching transistor 41 is electrically coupled to the scanning line 13. Further, one of the source and the drain of the switching transistor 41 is electrically coupled to the data line 14, and the other of the source and the drain is electrically coupled to the gate of the driving transistor 42 and one electrode of two electrodes included in the retention capacitor 43. Further, one of the source and drain of the driving transistor 42 is electrically coupled to the power supplying line 15, and the other of the source and the drain is electrically coupled to the pixel electrode 21. Note that, a power supply potential Vel on a high potential side is supplied from the power supply circuit (not illustrated) to the power supplying line 15.

Further, the other electrode of the retention capacitor 43 is electrically coupled to the power supplying line 15.

In the display panel 1 having such an electrical configuration, when the scanning line driving circuit 321 sequentially activates the scanning signals Gw [1], Gw [2] to Gw [M] and the scanning line 13 is selected, the switching transistor 41 included in the selected pixel P is turned on. Then, the data signals Vd [1], Vd [2] to Vd [N] are supplied from the N data lines 14 to the driving transistor 42 corresponding to the selected scanning lines 13. The driving transistor 42 supplies a current corresponding to potentials of the supplied data signals Vd [1], Vd [2] to Vd [N], that is, a current corresponding to a potential difference between the gate and the source, to the light-emitting element 200. Then, the light-emitting device 200 emits light at a luminance corresponding to a magnitude of the current supplied from the driving transistor 42.

Further, when the scanning line driving circuit 321 releases the selection of the scanning line 13 and the switching transistor 41 is turned off, the potential of the gate of the driving transistor 42 is held by the retention capacitor 43. Thus, the light-emitting device 200 can emit light even after the switching transistor 41 is turned off.

The electrical configuration of the display panel 1 is described above. Note that, the configuration of the current supply circuit 33 is not limited to the illustrated configuration. For example, a transistor that controls the conduction between the pixel electrode 21 and the driving transistor 42 may be further included.

1-1C. Configuration of Display Panel

Figure 4:
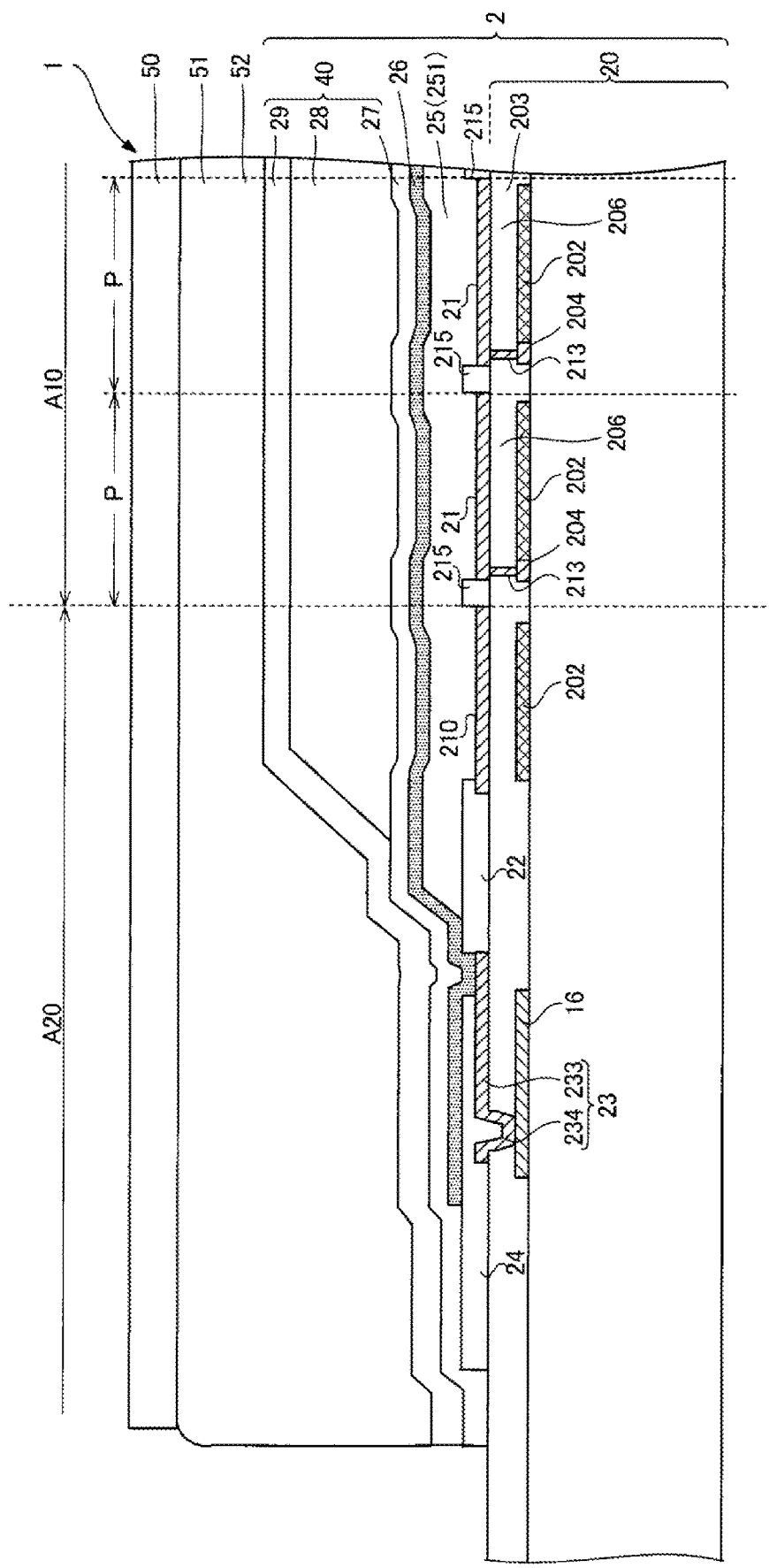
FIG. 4 is a partial cross-sectional view of the light-emitting device according to First Embodiment.

Next, the configuration of the display panel will be briefly described. FIG. 4 is a partial cross-sectional view of the light-emitting device according to First Embodiment. Note that, the direction of an arrow in the z-axis is a +z direction, which is referred to as an "upper side", and the direction opposite to the arrow in the z-axis is a −z direction, which is referred to as a "lower side".

The display panel 1 illustrated in FIG. 4 includes an element substrate 2 and a flat plate-shaped cover 50 bonded to the element substrate 2 with a bonding material 51.

The element substrate 2 includes a semiconductor substrate 20, a plurality of pixel electrodes 21, a plurality of dummy electrodes 210, a first substrate planar portion 22, a contact portion 23, a second substrate planar portion 24, an organic layer 25 including a light-emitting layer 251, a counter electrode 26, and a sealing layer 40. Note that, the display panel 1 is top-emission type, and light generated from the light-emitting layer 251 is emitted from the cover 50. Each part will be sequentially described below.

The semiconductor substrate 20 is not illustrated in detail, but includes, for example, a substrate body constituted of silicon, a wiring layer including a plurality of electronic components, wiring, and the like, and a plurality of interlayer insulating films constituted by a silicon nitride film or a silicon oxide film, for example. Note that, the constituent material of the substrate body is not limited to silicon, and may be, for example, glass, resin, ceramic, and the like. Furthermore, although not illustrated in detail, the control circuit 31, the driving circuit 32, the current supply circuit 33, the scanning lines 13, and the data lines 14 described above are formed on the semiconductor substrate 20.

Further, the semiconductor substrate 20 includes a plurality of reflective layers 202 corresponding to the plurality of pixel electrodes 21 or the dummy electrodes 210, and an insulating layer 203 covering the reflective layers 202. The reflective layer 202 reflects light generated from the light-emitting layer 251 in the +z direction. The constituent material of the reflective layer 202 is, for example, a metal such as aluminum and silver, or an alloy including these metals, and the like. Further, a portion of the insulating layer 203 between the reflective layer 202 and the pixel electrode 21 functions as an optical path adjustment unit 206 for resonating light of a desired wavelength. The film thickness of the optical path adjustment unit 206 is set so as to make an optical distance between the reflective layer 202 and the counter electrode 26 that will be described later, different for each pixel P. Thus, light of a specific resonance wavelength is extracted. Note that, the constituent material of the insulating layer 203 is, for example, an insulating material such as silicon oxynitride and silicon nitride.

Further, a terminal 204 for electrically coupling the pixel electrode 21 and the current supply circuit 33 illustrated in FIG. 3, and a power supplying line 16 for electrically coupling to the counter electrode 26 are disposed on the semiconductor substrate 20.

The pixel electrode 21, the dummy electrode 210, the contact portion 23, the first substrate planar portion 22, and the second substrate planar portion 24 are arranged on the semiconductor substrate 20.

The pixel electrode 21 is electrically coupled to the terminal 204 disposed on the semiconductor substrate 20 via an anode contact 213. Note that, although not illustrated in detail, the terminal 204 is electrically coupled to the driving transistor 42 illustrated in FIG. 3. Further, the constituent material of the pixel electrode 21 is a transparent conductive material such as Indium Tin Oxide (ITO) or Indium Zinc Oxide (IZO), for example. In addition, adjacent pixel electrodes 21 are insulated by a partition wall 215 that are arranged between the adjacent pixel electrodes and made from insulating material. The pixel electrode 21 and the anode contact 213 may be electrically coupled to the reflective layer 202.

The plurality of dummy electrodes 210 are aligned in a frame shape so as to surround the plurality of pixel electrodes 21 in plan view. Further, the plurality of dummy electrodes 210 are arranged in the non-light-emitting region A20 and are aligned so as to surround the light-emitting region A10 in plan view. The dummy electrode 210 has a similar configuration as the pixel electrode 21, but does not contribute to display. Further, the dummy electrode 210 is insulated from the pixel electrode 21 by the partition wall 215.

The contact portion 23 couples the counter electrode 26 located on an upper layer of the contact portion and the power supplying line 16 disposed on the semiconductor substrate 20. Note that, although not illustrated in detail, the power supplying line 16 is electrically coupled to the power supply circuit (not illustrated). Thus, the contact portion 23 functions as a cathode contact that electrically couples the counter electrode 26 and the power supplying line 16. Further, the contact portion 23 is disposed so as to surround the plurality of dummy electrodes 210 in plan view, and has a rectangular frame shape. The constituent material of the contact portion 23 is, for example, a conductive material and the like. In plan view, without completely surrounding the plurality of dummy electrodes 210, the contact portion 23 may be disposed along at least one side of the semiconductor substrate 20, or may be disposed along three sides of the semiconductor substrate 20.

As illustrated in FIG. 4, the contact portion 23 includes a planar portion 233 disposed on the insulating layer 203, and a step portion 234 disposed in a contact hole formed in the insulating layer 203. The planar portion 233 is coupled to the counter electrode 26 of the upper layer. The step portion 234 is coupled to the power supplying line 16. Further, in a cross-sectional view, the step portion 234 has a tapered shape in which the width continuously decreases toward the power supplying line 16. The tapered shape can reduce the occurrence of cracks in the step portion 234 as compared to a shape having a constant width. Therefore, oxidation and corrosion of the contact portion 23 due to cracks can be reduced, and further, oxidation and corrosion of the counter electrode 26 coupled to the contact portion 23 can be reduced. Note that, as illustrated in the drawings, the width of the step portion 234 continuously decreases toward the power supplying line 16, but the width of the step portion 234 may decrease stepwise toward the power supplying line 16.

The first substrate planar portion 22 and the second substrate planar portion 24 each have a function of filling steps in the top surface of the semiconductor substrate 20. By disposing the first substrate planar portion 22 and the second substrate planar portion 24, the counter electrode 26 can be stably formed as compared to a case where the first substrate planar portion 22 and the second substrate planar portion 24 are not disposed. The first substrate planar portion 22 is disposed so as to fill the dummy electrode 210 and the contact portion 23, and has a rectangular frame shape in plan view. The second substrate planar portion 24 is disposed so as to surround the contact portion 23 in plan view, and has a rectangular frame shape. Each of the constituent materials of the first substrate planar portion 22 and the second substrate planar portion 24 is insulating material such as silicon oxynitride and silicon nitride, for example. The first substrate planar portion 22 and the second substrate planar portion 24 may be a portion where the wiring such as the power supplying line 16 and the reflective layer 202, the electrode such as the dummy electrode 210 and the pixel electrode 21, and the transistor are not disposed, or may be a portion where, even when the wiring or the like is provided, the step due to the wiring or the like does not appear on the surface. The first substrate planar portion 22 and the second substrate planar portion 24 are portions in which the influences on the sealing layer 40 described below are minimized.

The organic layer 25 is disposed so as to cover the plurality of pixel electrodes 21 and the plurality of dummy electrodes 210. The organic layer 25 includes at least a light-emitting layer 251 that emits light by supplying current. Further, in the present embodiment, although not illustrated, the organic layer 25 includes a hole injection layer and an electron transportation layer in addition to the light-emitting layer 251. In the organic layer 25, holes injected from the hole injection layer and electrons injected from the electron transportation layer are recombined in the light-emitting layer 251. In addition, each of the layers included in the organic layer 25 is formed by, for example, depositing by a vapor phase process and then layering sequentially, respectively. Note that, the configuration of the organic layer 25 is optional, for example, the organic layer 25 may further include a hole transportation layer arranged between the light-emitting layer 251 and the hole injection layer. Furthermore, the organic layer 25 may include a plurality of light-emitting layers. For example, the organic layer 25 may include a blue light-emitting layer, a green light-emitting layer, and a red light-emitting layer.

The counter electrode 26 is disposed so as to cover the organic layer 25. The counter electrode 26 has light transmittance and light reflectivity. The counter electrode 26 is formed by magnesium and silver, or an alloy including these main components, and the like.

The sealing layer 40 is disposed so as to cover the counter electrode 26. The sealing layer 40 includes a first sealing layer 27, a planarization layer 28, and a second sealing layer 29. The first sealing layer 27 protects the counter electrode 26 and also the organic layer 25 from components contained in the planarization layer 28 and moisture in the atmosphere, and the like. The first sealing layer 27 is formed from, for example, an inorganic material such as silicon oxide, silicon nitride, and silicon oxynitride.

A planarization layer 28 is disposed on the first sealing layer 27. The planarization layer 28 functions to mitigate the unevenness of the first sealing layer 27 due to the configuration of the lower layer than the first sealing layer 27. Thus, the planarization layer 28 functions to reduce the size of the unevenness of the upper surface of the planarization layer 28 than the size of the unevenness of the upper surface of the counter electrode 26. In addition, the planarization layer 28 functions to protect the counter electrode 26, the first sealing layer 27 and the second sealing layer 29 respectively, by mitigating warping of the element substrate 2, mechanical impact applied from the outside, and the like, and to reduce the occurrence of cracks and the like in these layers. As the constituent material of the planarization layer 28, a resin material having translucency such as epoxy resin, acrylic resin, urethane resin, silicone resin, or the like can be used. Furthermore, the planarization layer 28 can be formed by using, for example, a printing method such as a screen printing method, or a liquid phase deposition method.

The second sealing layer 29 is disposed so as to cover the planarization layer 28 and the first sealing layer 27. The second sealing layer 29 functions to prevent oxygen, moisture, and the like in the atmosphere from entering. The constituent material of the second sealing layer 29 is formed from, for example, an inorganic material such as silicon oxide, silicon nitride, or silicon oxynitride. Note that, the first sealing layer 27 and the second sealing layer 29 may be formed from the same material or may be formed from mutually different materials. Furthermore, the first sealing layer 27 and the second sealing layer 29 can be respectively formed using, for example, a gas phase deposition method such as ion plating, vacuum deposition, sputtering, or laser ablation.

A flat plate-shaped cover 50 is disposed on the element substrate 2 having such a configuration via the bonding material 51. The constituent material of the bonding material 51 is a transparent resin material such as an epoxy resin and an acrylic resin. The cover 50 is light-transmissive and is constituted by, for example, a glass substrate or a quartz substrate.

In addition, although not illustrated, a color filter including a red (R), green (G), and blue (B) colored layers is disposed on the upper surface of the element substrate 2. The color filter is arranged between the element substrate 2 and the cover 50. The display panel 1 enables full color display by combining the light-emitting element 200 that emits white light and the color filter described above. The color filter may be formed on the element substrate 2.

1-1D. Arrangement of Planarization Layer with Respect to Light-Emitting Layer

Figure 5:
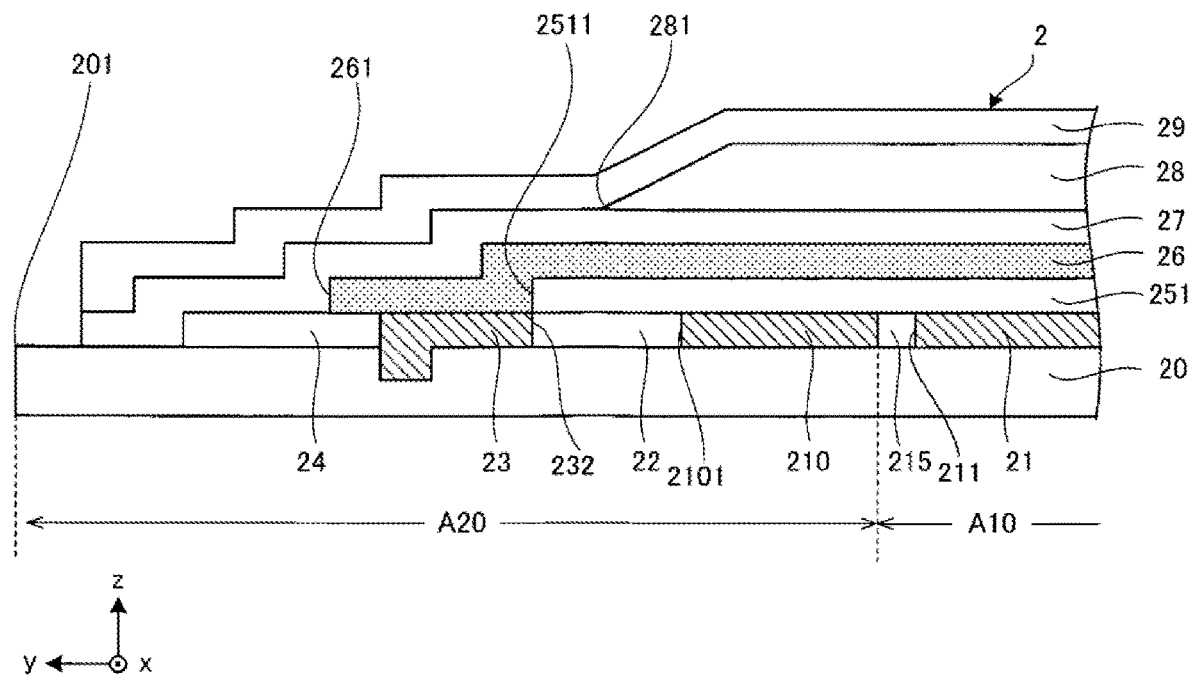
FIG. 5 is a schematic cross-sectional view illustrating a part of an element substrate according to First Embodiment.
Figure 6:
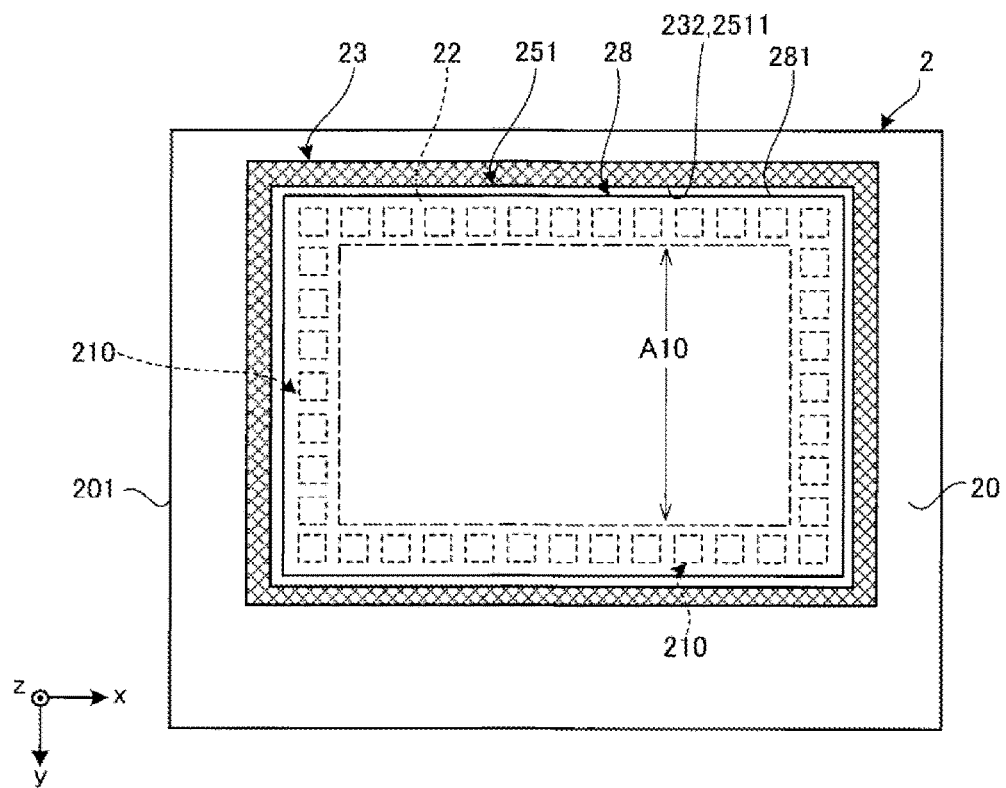
FIG. 6 is a schematic plan view for explaining an arrangement of an organic layer and a planarization layer according to First Embodiment.

FIG. 5 is a schematic cross-sectional view illustrating a part of the element substrate according to First Embodiment. FIG. 6 is a schematic plan view for explaining an arrangement of the organic layer and the planarization layer according to First Embodiment. Further, in FIG. 5, illustrations of layers other than the light-emitting layer 251 of the organic layer 25 are omitted. In FIG. 6, the contact portion 23 is shaded.

As illustrated in FIGS. 5 and 6, the light-emitting layer 251 covers the dummy electrode 210 and the first substrate planar portion 22 in plan view. Further, in plan view, an outer edge 2511 of the light-emitting layer 251 overlaps an inner edge 232 of the contact portion 23.

Further, an outer edge 281 of the planarization layer 28 is located inward of the outer edge 2511 of the light-emitting layer 251 in plan view. In addition, the planarization layer 28 covers a part of the first substrate planar portion 22 in plan view, and the outer edge 281 of the planarization layer 28 is located between the dummy electrode 210 and the contact portion 23 in plan view. In addition, the outer edge 281 of the planarization layer 28 is located upside the first substrate planar portion 22. Further, the planarization layer 28 covers a part of the counter electrode 26 in plan view. In other words, the outer edge 281 of the planarization layer 28 is located inward of the outer edge 261 of the counter electrode 26 in plan view.

As described above, the display panel 1 includes the semiconductor substrate 20 as a "substrate" on which the pixel circuit 30 as a "circuit" is disposed, the pixel electrode 21 as a "first electrode" that is electrically connected to the pixel circuit 30, and the counter electrode 26 as a "second electrode", the light-emitting layer 251, and the planarization layer 28. The pixel electrode 21 is arranged between the semiconductor substrate 20 and the counter electrode 26. The light-emitting layer 251 is arranged between the pixel electrode 21 and the counter electrode 26, and emits light according to the current flowing through the light-emitting layer 251. The sealing layer 40 including the planarization layer 28 is arranged on a side opposite to a side of the counter electrode 26 on which the light-emitting layer 251 is arranged. Furthermore, when viewed in plan view, that is, viewed from a direction in which the pixel electrode 21 and the counter electrode 26 are layered, the outer edge 281 of the planarization layer 28 is located inward of the outer edge 2511 of the light-emitting layer 251.

According to the display panel 1 having such a configuration, the outer edge 281 of the planarization layer 28 is located inward of the outer edge 2511 of the light-emitting layer 251 in plan view, thus, the distance from the outer edge 2511 of the light-emitting layer 251 to the outer edge 201 of the semiconductor substrate 20, that is, the width of a frame around the light-emitting region A10 of the light-emitting device 100, can be narrowed. Accordingly, the light-emitting device 100 can be made smaller.

Figure 7:
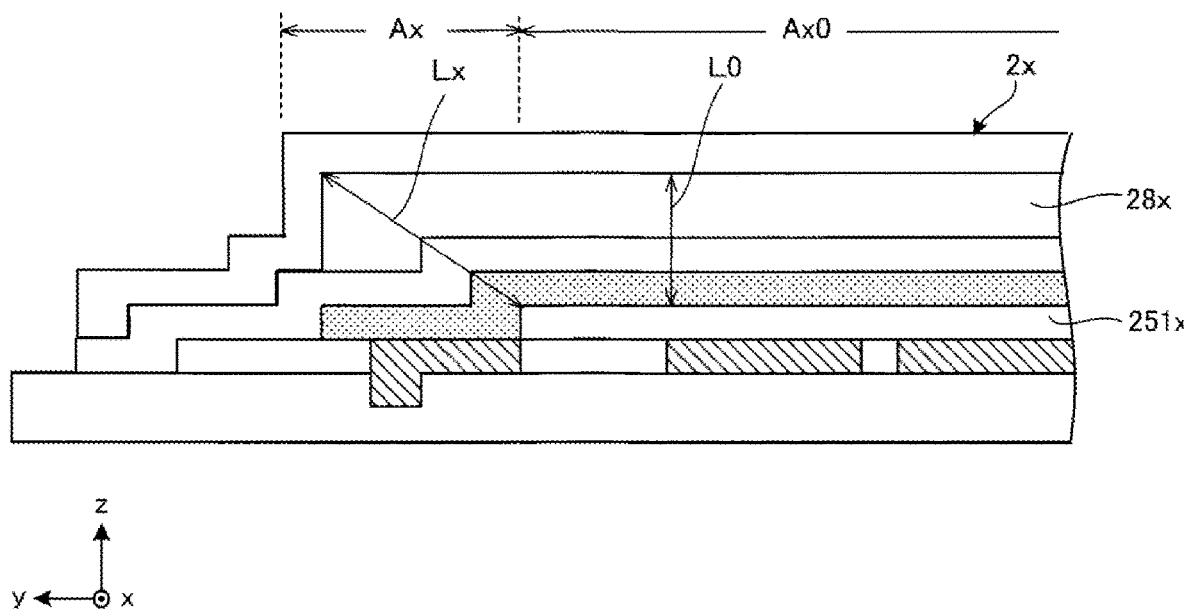
FIG. 7 is a diagram illustrating a related example of a configuration in which the planarization layer is disposed so as to cover a light-emitting layer.

FIG. 7 is a diagram illustrating a Conventional Example of a configuration in which a planarization layer is disposed to cover a light-emitting layer. An element substrate 2x illustrated in FIG. 7 is arranged so that a planarization layer 28x covers a light-emitting layer 251x in plan view. In plan view, the planarization layer 28x includes a region Ax0 that overlaps the light-emitting layer 251x and a region Ax that does not overlap the light-emitting layer 251x. A distance Lx from the outer surface of the planarization layer 28x in the region Ax to the light-emitting layer 251 is greater than a distance L0 from the outer surface of the planarization layer 28 in the region Ax0 to the light-emitting layer 251. Thus, when there is a defect in the planarization layer 28x in the region Ax, as compared with a case where there is a defect in the planarization layer 28x in the region Ax0, the time for the moisture entering the defect to reach the light-emitting layer 251 is longer. Thus, a defect such as a dark spot in the light-emitting layer 251 due to the defect in the planarization layer 28x in the region Ax is difficult to detect early as compared with a defect such as a dark spot in the light-emitting layer 251 due to the defect in the planarization layer 28x in the region Ax0. When the light-emitting device 100 is initially turned on, a dark spot due to a defect in the sealing layer 40 may not be detected, and may be detected after a predetermined time.

In contrast, in the display panel 1, the outer edge 281 of the planarization layer 28 is located inward of the outer edge 2511 of the light-emitting layer 251 in plan view, and thus the outer edge does not have a region that does not overlap the light-emitting layer 251 in plan view. Therefore, the outer edge 281 of the planarization layer 28 and the outer edge 2511 of the light-emitting layer 251 are arranged in close proximity, and thus the dark spot is easy to be detected early. Therefore, reliability of the light-emitting device 100 can be increased.

Further, as described above, the display panel 1 according to the present embodiment further includes the dummy electrode 210 arranged between the semiconductor substrate 20 and the planarization layer 28, and the contact portion 23 that is arranged between the semiconductor substrate 20 and the planarization layer 28 and that couples the counter electrode 26 and the wiring. In addition, the dummy electrode 210 is arranged between the outer edge 211 of the pixel electrode 21 and the outer edge 201 of the semiconductor substrate 20 in plan view. In addition, the contact portion 23 is arranged between the outer edge 2101 of the dummy electrode 210 and the outer edge 201 of the semiconductor substrate 20 in plan view. Then, the light-emitting layer 251 and the planarization layer 28 respectively overlap the entirety of the dummy electrodes 210 in plan view.

By making the light-emitting layer 251 and the planarization layer 28 overlap the entirety of the dummy electrodes 210 located outside of the pixel electrode 21 in plan view, the design margin can be increased as compared to a case where the light-emitting layer 251 and the planarization layer 28 do not overlap the entirety of the dummy electrodes 210. Specifically, each of the light-emitting layer 251 and the planarization layer 28 reliably covers the pixel electrode 21, and it is easy to manufacture such that the planarization layer 28 is located inward of the outer edge 2511 of the light-emitting layer 251 in plan view.

The outer edge 281 of the planarization layer 28 is located between the dummy electrode 210 and the contact portion 23 in plan view. In other words, the planarization layer 28 is disposed to cover a part of the first substrate planar portion 22.

By disposing the planarization layer 28 to cover a part of the first substrate planar portion 22, the pixel electrode 21 can be covered with a portion in which the thickness of the planarization layer 28 is uniform, that is, a portion excluding an outer periphery and a vicinity of the planarization layer 28. Therefore, the planarization of the portion overlapping the pixel electrode 21 in plan view of the planarization layer 28 can be increased. In addition, in the present embodiment, although the inner edge 232 of the contact portion 23 and the outer edge 2511 of the light-emitting layer 251 overlap in plan view, the planarization layer 28 does not overlap this overlapping portion. Therefore, the step due to the overlapping portion is difficult to affect the sealing layer 40. As a result, the quality of the display panel 1 can be improved.

1-2. Second Embodiment

Figure 8:
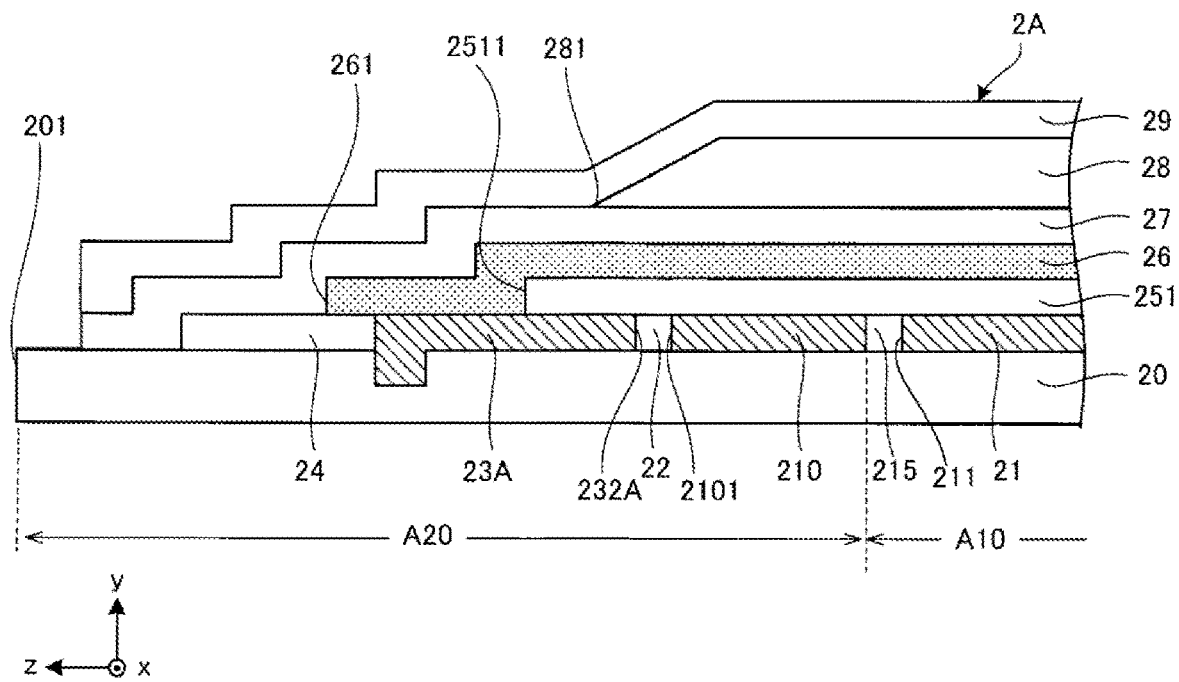
FIG. 8 is a schematic cross-sectional view illustrating a part of an element substrate according to Second Embodiment.

Next, Second Embodiment of the present disclosure will be described. FIG. 8 is a schematic cross-sectional view illustrating a part of an element substrate according to Second Embodiment.

The present embodiment is substantially the same as First Embodiment, except that the arrangement of the contact portion is mainly different. Note that, the following descriptions focus on differences between the present embodiment and the First Embodiment, and thus, descriptions of similar matters will be omitted. Further, in FIG. 8, the same reference numbers are given to the same configurations as in First Embodiment.

In an element substrate 2A illustrated in FIG. 8, a light-emitting layer 251 overlaps a part of a contact portion 23A in plan view. A planarization layer 28 also overlaps a part of the contact portion 23A in plan view.

The design margin can be increased as compared to a case where the light-emitting layer 251 and the planarization layer 28 do not overlap the contact portion 23A. Specifically, each of the light-emitting layer 251 and the planarization layer 28 reliably covers the pixel electrode 21, and it is easy to manufacture such that the planarization layer 28 is located inward of the outer edge 2511 of the light-emitting layer 251 in plan view. The production yield can also be increased. Further, similar to the contact portion 23 illustrated in FIG. 4, the contact portion 23A may also include a planar portion and a step portion, and the light-emitting layer 251 and the planarization layer 28 overlap the planar portion of the contact portion 23A. Further, the light-emitting layer 251 and the planarization layer 28 may not overlap the region of the contact portion 23A that is coupled to the counter electrode 26.

In addition, in the present embodiment, the light-emitting layer 251 overlaps a part of the contact portion 23A in plan view, and thus an inner edge 232A of the contact portion 23A and an outer edge 2511 of the light-emitting layer 251 do not overlap. Therefore, the planarization of an upper layer of the light-emitting layer 251 can be further increased than that in First Embodiment.

According to the present embodiment, as in First Embodiment, the light-emitting device 100 having high reliability can be provided.

1-3. Third Embodiment

Figure 9:
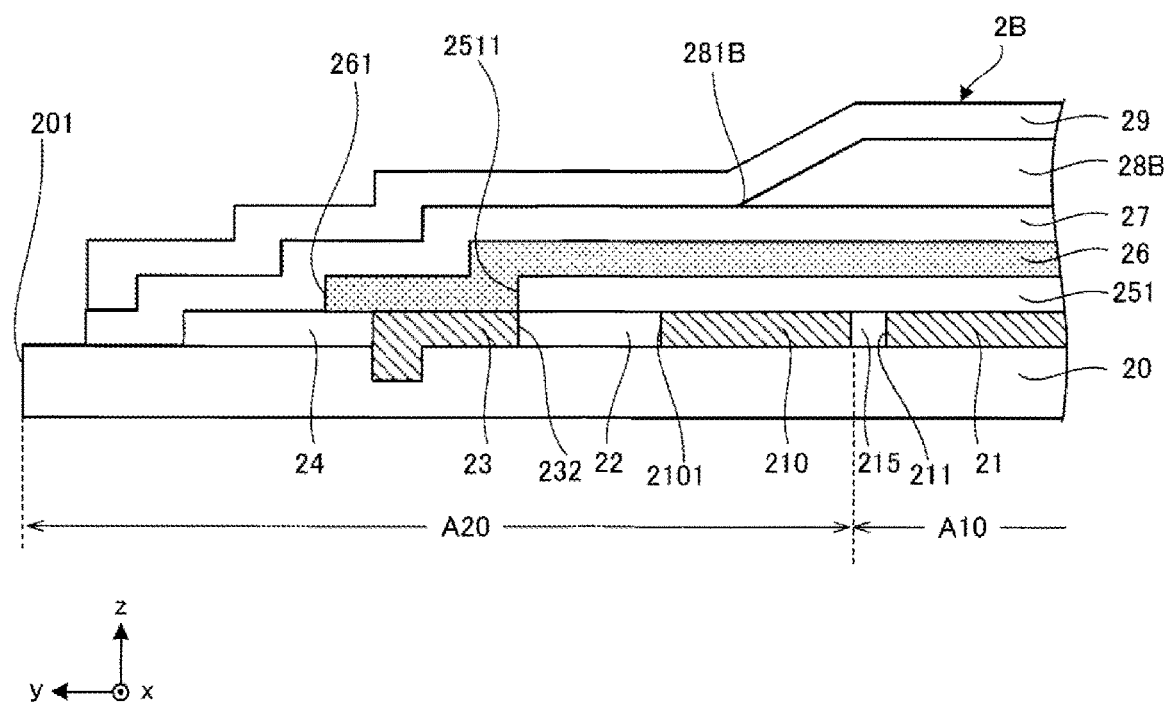
FIG. 9 is a schematic cross-sectional view illustrating a part of an element substrate according to Third Embodiment.

Next, Third Embodiment of the present disclosure will be described. FIG. 9 is a schematic cross-sectional view illustrating a part of an element substrate according to Third Embodiment.

The present embodiment is substantially the same as First Embodiment, except that the arrangement of the planarization layer is mainly different. Note that, the following descriptions focus on differences between the present embodiment and First Embodiment, and thus, descriptions of similar matters will be omitted. Further, in FIG. 9, the same reference numbers are given to the same configurations as in First Embodiment.

A planarization layer 28B included in an element substrate 2B illustrated in FIG. 9 overlaps a part of the dummy electrodes 210 in plan view.

By making the outer edge 281B of the planarization layer 28B overlaps a part of the dummy electrodes 210 in plan view, as compared with a case where the entirety the dummy electrodes are overlapped, the portion where the planarization layer 28B does not overlap with the pixel electrodes 21 can be made smaller. Therefore, the distance from the outer surface of the planarization layer 28B to the light-emitting layer 251 can be shortened in the entire region of the planarization layer 28B, thus, even if there is a defect in the planarization layer 28B, it is easy to early detect a failure in the light-emitting layer 251 due to the defect.

According to the present embodiment, as in First Embodiment, the light-emitting device 100 having high reliability can be provided.

1-4. Modification Examples

Each of the embodiments exemplified above can be variously modified. Specific modification aspects applied to each of the embodiments described above are exemplified below. Two or more modes freely selected from exemplifications below can be appropriately used in combination as long as mutual contradiction does not arise.

Figure 10:
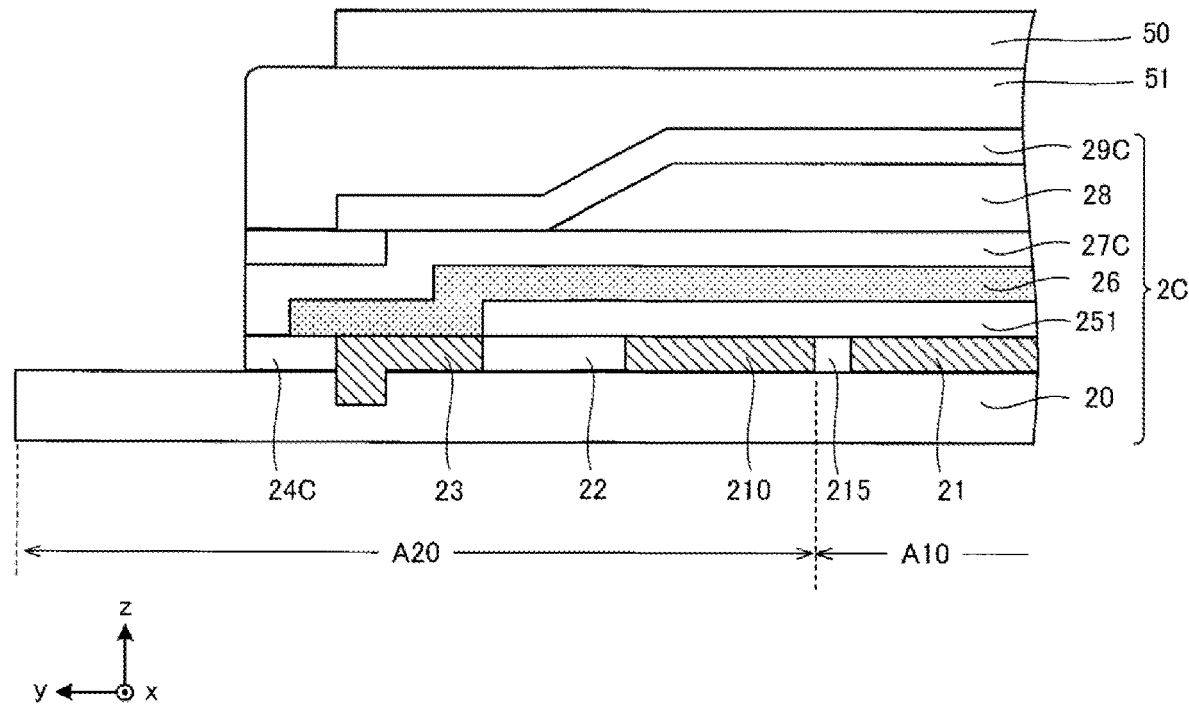
FIG. 10 is a schematic cross-sectional view illustrating a part of a light-emitting device according to a first modified example.

(1) FIG. 10 is a schematic cross-sectional view illustrating a part of a light-emitting device according to a first modified example. In the embodiments described above, as illustrated in FIG. 2, the first sealing layer 27 is disposed to cover the second substrate planar portion 24, but the first sealing layer 27 may not cover the second substrate planar portion 24. For example, as illustrated in FIG. 10, a first sealing layer 27C included in an element substrate 2C may not cover the outer surface of a second substrate planar portion 24C. Similarly, a second sealing layer 29C included in the element substrate 2C does not cover the outer surface of the second substrate planar portion 24C or the outer surface of the first sealing layer 27C. Even with such a configuration, the reliability can be increased as in the embodiments described above.

Figure 11:
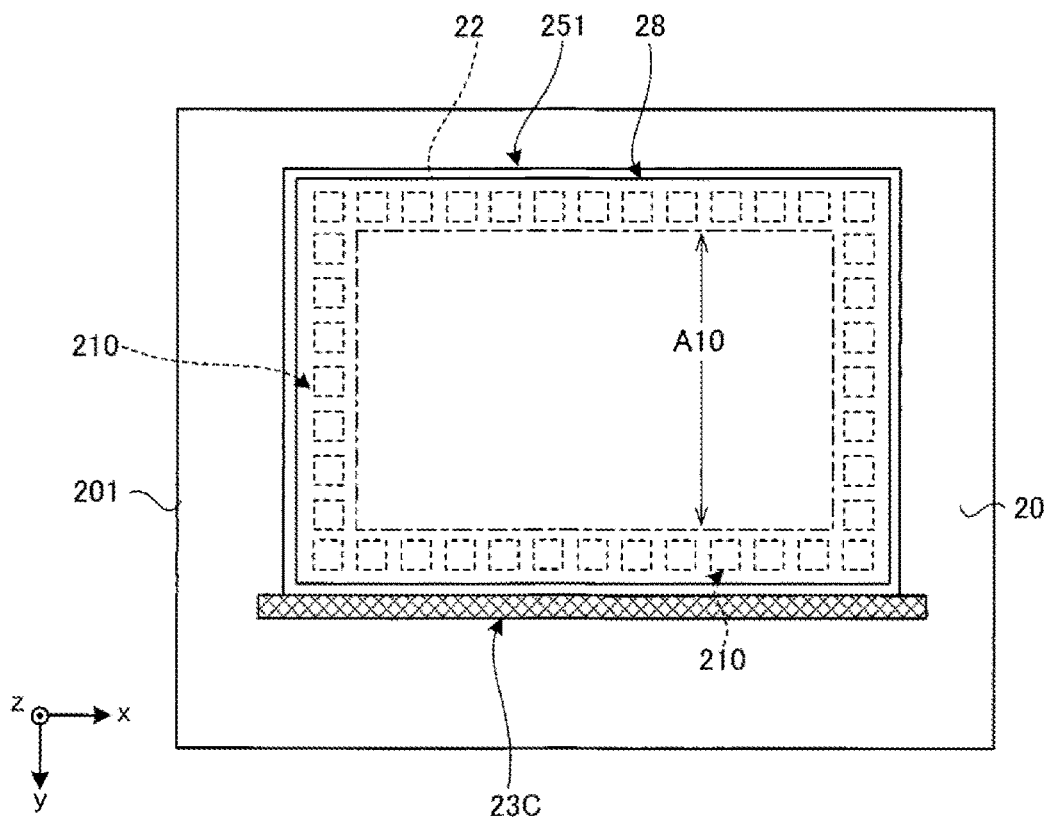
FIG. 11 is a schematic plan view illustrating a contact portion according to a second modified example.

(2) FIG. 11 is a schematic plan view illustrating a contact portion according to a second modified example. In the embodiments described above, as illustrated in FIG. 5 or FIG. 6, the contact portion 23 surrounds the plurality of dummy electrodes 210 and the plurality of pixel electrodes 21 in plan view, and has a rectangular shape in plan view, but the arrangement and plan view shape of the contact portion 23 are not limited to this, they are optional. For example, as a contact portion 23C illustrated in FIG. 11, the contact portion 23C may have a rectilinear shape in plan view and may be arranged along one side of the semiconductor substrate 20.

(3) In each of the embodiments described above, the organic EL display device is described as an example of the "light-emitting device" of the present disclosure, but the "light-emitting device" of the present disclosure may be an inorganic EL display device. In this case, the "light-emitting layer" can be configured by, for example, a layer in which a metal compound is dispersed in a host material of a semiconductor material. Further, the "light-emitting device" may be an illumination light source instead of a display device that displays images. Further, the display panel 1 may not include a color filter.

(4) In each of the embodiments described above, the number of the pixel electrodes 21 included in the display panel 1 is plural, but the number may be one. Further, the number of the counter electrodes 26 may be plural.

(5) In each of the embodiments described above, an example has been described when the "first electrode" is the pixel electrode 21 and functions as a cathode, and the "second electrode" is the counter electrode 26 and functions as an anode, however, the "first electrode" may function as the anode, and the "second electrode" may function as the cathode. In this case, the "contact portion" may be an anode contact.

(6) In each of the embodiments described above, the display panel 1 includes the dummy electrodes 210, but the display panel 1 may not include the dummy electrodes 210.

(7) In each of the embodiments described above, the light-emitting layer 251 overlaps the entirety of the dummy electrodes 210, but the light-emitting layer may overlap only a part of the dummy electrodes 210 or may not overlap the dummy electrodes 210. In addition, the planarization layer 28 may overlap the entirety or a part of the dummy electrodes 210, but may not overlap the dummy electrode 210.

2. Electronic Apparatus

The light-emitting device according to the embodiments or the modified examples described above can be applied to various electronic apparatuses, and is particularly suitable for electronic apparatuses required to display a high-definition image of 2K2K or higher and required to be compact.

Figure 12:
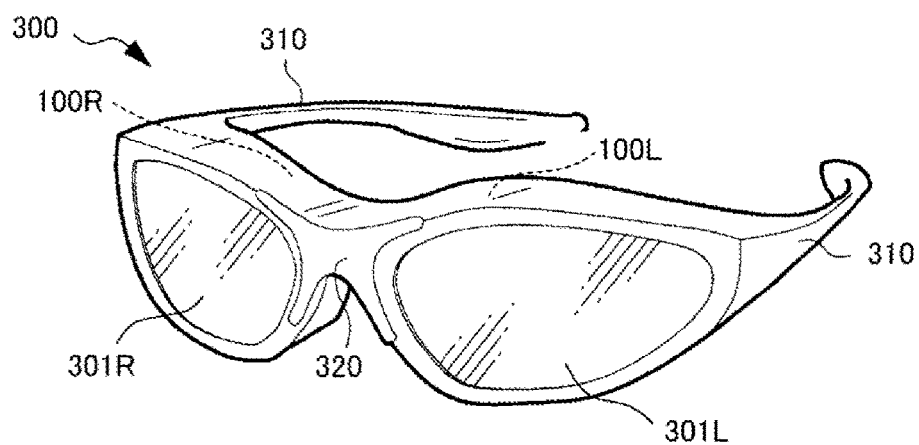
FIG. 12 is a perspective view illustrating a head-mounted display as an example of an electronic apparatus including a light-emitting device according to the present disclosure.

FIG. 12 is a perspective view illustrating a head-mounted display as an example of an electronic apparatus including a light-emitting device according to the present disclosure. As illustrated in FIG. 12, a head-mounted display 300 includes a temple 310, a bridge 320, a projection optical system 301L, and a projection optical system 301R. A light-emitting device 100L for left eye is disposed at the back of a projection optical system 301L, and a light-emitting device 100R for right eye is disposed at the back of a projection optical system 301R. Note that the light-emitting devices 100R and 100L can apply the light-emitting device 100 described above.

Figure 13:
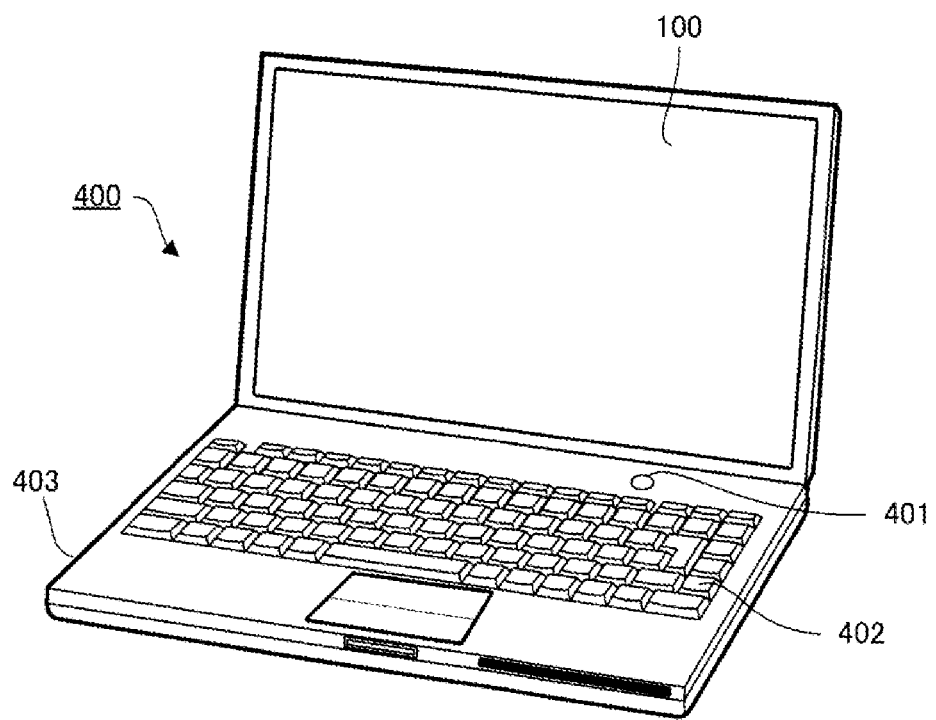
FIG. 13 is a perspective diagram illustrating a personal computer as an example of an electronic apparatus including a light-emitting device according to the present disclosure.

FIG. 13 is a perspective diagram illustrating a personal computer as an example of an electronic apparatus including a light-emitting device according to the present disclosure. A personal computer 400 includes a light-emitting device 1, and a main body 403 provided with a power switch 401 and a keyboard 402.

The head-mounted display 300 and the personal computer 400 include the above-described light-emitting device 100 having high reliability, thus the reliability can be increased over a long period of time.

Note that examples of the electronic apparatus including the light-emitting device 100 include, in addition to the apparatuses illustrated in FIGS. 11 and 12, an electronic apparatus arranged close to eyes such as a digital scope, a pair of digital binoculars, a digital still camera, and a video camera. Further, the present disclosure can be applied as a display unit disposed in an electronic apparatus such as a mobile phone, a smartphone, a Personal Digital Assistant (PDA), a car navigation device, and an automotive display.

What is claimed is:

1. A light-emitting device, comprising a substrate having a circuit thereon, a first electrode electrically coupled to the circuit, a second electrode, a light-emitting layer, a sealing layer including a planarization layer, a dummy electrode arranged between the substrate and the planarization layer, and a contact portion arranged between the substrate and the planarization layer and coupling a wiring and the second electrode, wherein
    the first electrode is arranged between the substrate and the second electrode,
    the light-emitting layer is arranged between the first electrode and the second electrode, and emits light in accordance with a current flowing through the light-emitting layer,
    the planarization layer is arranged on an opposite side of the second electrode from a side on which the light-emitting layer is arranged,
    an outer edge of the planarization layer is located inward of an outer edge of the light-emitting layer in plan view,
    the dummy electrode is arranged between an outer edge of the first electrode and an outer edge of the substrate in the plan view,
    the contact portion is arranged between an outer edge of the dummy electrode and the outer edge of the substrate in the plan view, and
    the planarization layer overlaps with an entirety of or a part of the dummy electrode in the plan view.

2. The light-emitting device according to claim 1, wherein the planarization layer overlaps an entirety of the dummy electrode in the plan view.

3. The light-emitting device according to claim 1, wherein the outer edge of the planarization layer is located between the dummy electrode and the contact portion in the plan view.

4. The light-emitting device according to claim 1, wherein the planarization layer overlaps a part of the dummy electrode in the plan view.

5. The light-emitting device according to claim 1, wherein the light-emitting layer overlaps a part of the contact portion in the plan view.

6. An electronic apparatus comprising the light-emitting device according to claim 1.

7. A light-emitting device, comprising:
    a substrate;
    a first electrode;
    a second electrode;
    a light-emitting layer arranged between the first electrode and the second electrode;
    a sealing layer including a planarization layer; and
    a dummy electrode that is arranged in a layer between the substrate and the planarization layer, and that is arranged between an outer edge of the first electrode and an outer edge of the substrate in a plan view,
    wherein
    the first electrode is arranged in a layer between the substrate and the second electrode,
    the planarization layer is arranged on an opposite side of the second electrode from a side on which the light-emitting layer is arranged,
    an outer edge of the planarization layer is located inward of an outer edge of the light-emitting layer in the plan view, and
    the outer edge of the planarization layer is located between an outer edge of the dummy electrode and the outer edge of the substrate in the plan view.

8. The light-emitting device according to claim 7, further comprising a contact portion that is arranged between the substrate and the planarization layer, and that electrically connects between a wiring and the second electrode, wherein
    the contact portion is arranged between the outer edge of the dummy electrode and the outer edge of the substrate in the plan view.

9. The light-emitting device according to claim 7, wherein the planarization layer overlaps with an entirety of the dummy electrode in the plan view.

10. The light-emitting device according to claim 8, wherein the planarization layer overlaps with an entirety of the dummy electrode in the plan view.

11. The light-emitting device according to claim 8, wherein the outer edge of the planarization layer is located between the dummy electrode and the contact portion in the plan view.

12. The light-emitting device according to claim 10, wherein the outer edge of the planarization layer is located between the dummy electrode and the contact portion in the plan view.

13. The light-emitting device according to claim 7, wherein the planarization layer overlaps with a part of the dummy electrode in the plan view.

14. An electronic apparatus comprising the light-emitting device according to claim 7.

* * * * *